(12) United States Patent
Nishisaka

(10) Patent No.: US 11,061,340 B2
(45) Date of Patent: Jul. 13, 2021

(54) MOUNT, EXTREME ULTRAVIOLET LIGHT GENERATION SYSTEM, AND DEVICE MANUFACTURING METHOD

(71) Applicant: Gigaphoton Inc., Tochigi (JP)

(72) Inventor: Toshihiro Nishisaka, Oyama (JP)

(73) Assignee: Gigaphoton Inc., Tochigi (JP)

( * ) Notice: Subject to any disclaimer, the term of this patent is extended or adjusted under 35 U.S.C. 154(b) by 0 days.

(21) Appl. No.: 16/985,148

(22) Filed: Aug. 4, 2020

(65) Prior Publication Data

US 2020/0363733 A1 Nov. 19, 2020

Related U.S. Application Data

(63) Continuation of application No. PCT/JP2018/009728, filed on Mar. 13, 2018.

(51) Int. Cl.
*G03F 7/20* (2006.01)

(52) U.S. Cl.
CPC ...... *G03F 7/70775* (2013.01); *G03F 7/70725* (2013.01); *G03F 7/70825* (2013.01)

(58) Field of Classification Search
CPC ............ G03F 7/70775; G03F 7/70725; G03F 7/70825
USPC ..................................... 250/491.1
See application file for complete search history.

(56) References Cited

U.S. PATENT DOCUMENTS

| | | | |
|---|---|---|---|
| 9,198,273 B2 * | 11/2015 | Igarashi | H05G 2/008 |
| 2008/0104828 A1 | 5/2008 | Someya et al. | |
| 2010/0051832 A1 | 3/2010 | Nishisaka et al. | |
| 2010/0193711 A1 | 8/2010 | Watanabe et al. | |
| 2013/0105713 A1 | 5/2013 | Watanabe et al. | |
| 2014/0008552 A1 | 1/2014 | Umeda et al. | |
| 2014/0332700 A1 | 11/2014 | Igarashi et al. | |
| 2017/0215267 A1 * | 7/2017 | Abe | H05G 2/005 |
| 2018/0034228 A1 | 2/2018 | Funaoka et al. | |

FOREIGN PATENT DOCUMENTS

| | | |
|---|---|---|
| JP | 2001350000 A | 12/2001 |
| JP | 2008118020 A | 5/2008 |
| JP | 2009006802 A | 1/2009 |
| JP | 2010080941 A | 4/2010 |
| JP | 2011029587 A | 2/2011 |

(Continued)

OTHER PUBLICATIONS

International Search Report issued in PCT/JP2018/009728; dated Jun. 19, 2018.

(Continued)

*Primary Examiner* — Hung Nguyen
(74) *Attorney, Agent, or Firm* — Studebaker & Brackett PC

(57) ABSTRACT

A mount includes: A. a mount body including a holding unit that detachably holds a target generation device configured to output a target substance for extreme ultraviolet light generation as a droplet into a chamber; and B. a target position adjustment unit that is provided to the holding unit and configured to adjust a position of the target generation device relative to the chamber; and C. a movement mechanism that moves the mount body at least in a horizontal direction. The target position adjustment unit is a stage configured to move the target generation device in two directions orthogonal to a droplet emission axis.

15 Claims, 15 Drawing Sheets

(56) References Cited

FOREIGN PATENT DOCUMENTS

| | | |
|---|---|---|
| JP | 2011508122 A | 3/2011 |
| JP | 2013069655 A | 4/2013 |
| JP | 2013175431 A | 9/2013 |
| JP | 2014010954 A | 1/2014 |
| NO | 2009083644 A1 | 7/2009 |
| WO | 2016171158 A1 | 10/2016 |

OTHER PUBLICATIONS

International Preliminary Report on Patentability and Written Opinion issued in PCT/JP2018/009728; dated Sep. 15, 2020.

\* cited by examiner

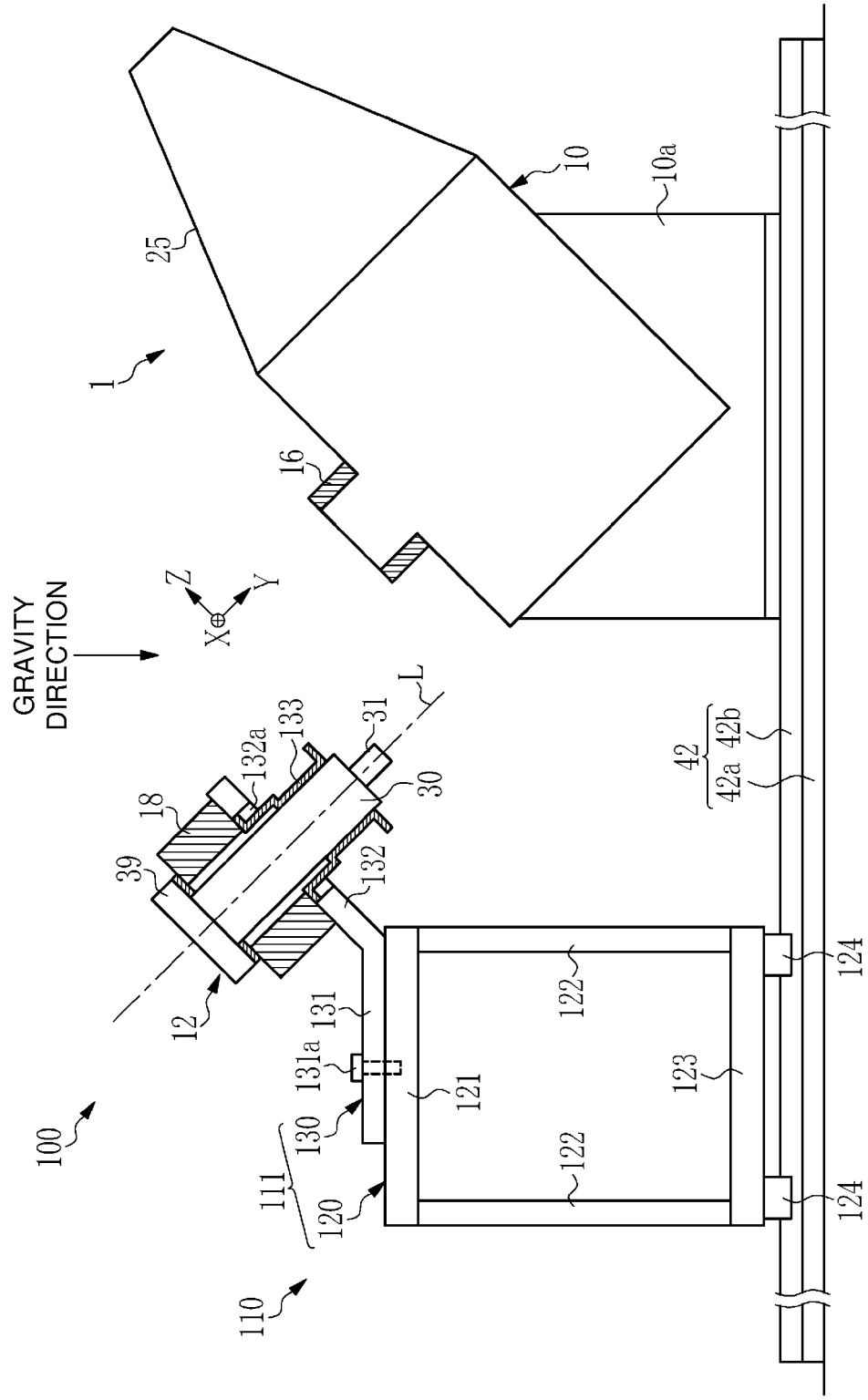

MOUNT, EXTREME ULTRAVIOLET LIGHT GENERATION SYSTEM, AND DEVICE MANUFACTURING METHOD

CROSS-REFERENCE TO RELATED APPLICATIONS

The present application is a continuation application of International Application No. PCT/JP2018/009728 filed on Mar. 13, 2018. The content of the application is incorporated herein by reference in its entirety.

BACKGROUND

1. Technical Field

The present disclosure relates to a mount, an extreme ultraviolet light generation system, and a device manufacturing method.

2. Related Art

Recently, miniaturization of a transfer pattern in optical lithography of a semiconductor process has been rapidly proceeding along with miniaturization of the semiconductor process. Minute fabrication at 20 nm or smaller will be requested in the next generation technology. To meet the request, it is desired to develop an exposure device including a device configured to generate extreme ultraviolet (EUV) light at a wavelength of 13 nm approximately in combination with reduced projection reflective optics.

Disclosed EUV light generation devices include three kinds of devices of a laser produced plasma (LPP) device that uses plasma generated by irradiating a target material with a laser beam, a discharge produced plasma (DPP) device that uses plasma generated by electrical discharge, and a synchrotron radiation (SR) device that uses synchrotron radiation.

LIST OF DOCUMENTS

Patent Documents

Patent Document 1: Japanese Unexamined Patent Application Publication No. 2009-6802
Patent Document 2: National Publication of International Patent Application No. 2011-508122
Patent Document 3: Japanese Unexamined Patent Application Publication No. 2008-118020
Patent Document 4: Japanese Unexamined Patent Application Publication No. 2014-10954

SUMMARY

A mount according to an aspect of the present disclosure includes:

A. a mount body including a holding unit that detachably holds a target generation device configured to output a target substance for extreme ultraviolet light generation as a droplet into a chamber;

B. a target position adjustment unit that is provided to the holding unit and configured to adjust a position of the target generation device relative to the chamber; and C. a movement mechanism that moves the mount body at least in a horizontal direction.

An extreme ultraviolet light generation system according to another aspect of the present disclosure includes:

F. the above-described mount; and

G. a chamber on which the target generation device held by the mount is mounted.

A device manufacturing method according to another aspect of the present disclosure includes:

exposing a workpiece to a laser beam output from the above-described extreme ultraviolet light generation system.

BRIEF DESCRIPTION OF THE DRAWINGS

Embodiments of the present disclosure will be described below as examples with reference to the accompanying drawings.

FIG. 4A illustrates a state before the attachment; and FIG. 4B illustrates a state after the attachment.

FIG. 5 is a diagram schematically illustrating the configuration of an EUV light generation system according to a first embodiment in a state in which a mount is separated from the chamber.

DESCRIPTION OF EMBODIMENTS

Contents

Figure 1:
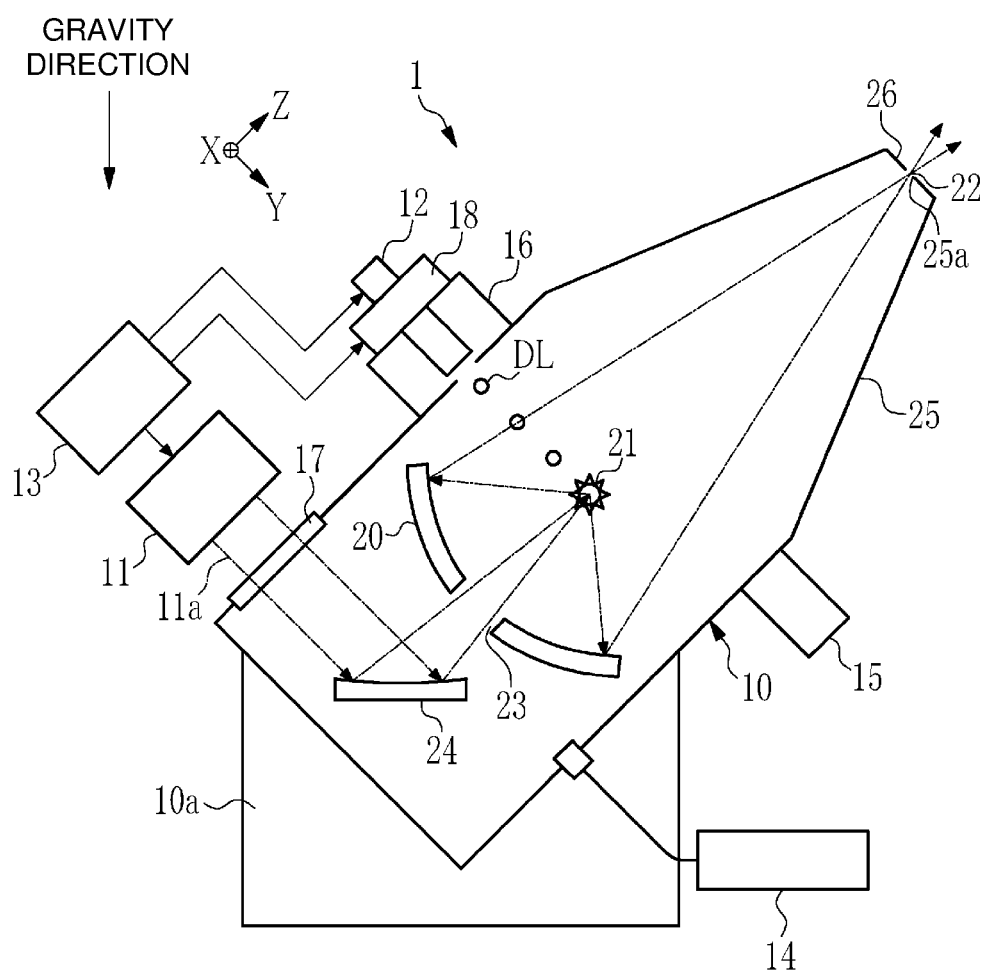
FIG. 1 is a schematic view illustrating the configuration of an EUV light generation device according to a comparative example.

1. Comparative example
 1.1 EUV light generation device
  1.1.1 Configuration
  1.1.2 Operation 1.2 Target generation device
1.2.1 Configuration
1.2.2 Operation
1.3 Chamber movement mechanism
1.4 Target generation device replacement method
1.5 Problem
2. First embodiment
2.1 Configuration
2.1.1 Overall configuration
2.1.2 Stage
2.2 Operation
2.3 Effect
3. Second embodiment
3.1 Configuration
3.2 Operation
3.3 Effect
4. Third embodiment
4.1 Configuration
4.2 Effect Embodiments of the present disclosure will be described below in detail with reference to the accompanying drawings. The embodiments described below are examples of the present disclosure, and do not limit the contents of the present disclosure. Not all configurations and operations described in each embodiment are necessarily essential as configurations and operations of the present disclosure. Components identical to each other are denoted by an identical reference sign, and duplicate description thereof will be omitted.

1. Comparative Example 1.1 EUV Light Generation Device 1.1.1 Configuration

An EUV light generation device 1 employs a laser-produced plasma (LPP) scheme in which EUV light is produced by exciting a target substance through irradiation with a laser beam. In FIG. 1, the EUV light generation device 1 includes a chamber 10, a driver laser 11, a target generation device 12, and a control unit 13.

The chamber 10 is a sealable container. The driver laser 11 is a master oscillator power amplifier type laser device that generates a drive pulse laser beam 11a used to excite the target substance. The target generation device 12 supplies the target substance into the chamber 10. The target generation device 12 is connected with a stage 18 configured to adjust the position of the target generation device 12 relative to the chamber 10. The target generation device 12 is connected with, through the stage 18, a mounting part 16 provided to the chamber 10.

The target substance may be solid, liquid, or gas. The target generation device 12 may supply the target substance into the chamber 10 in a well-known form such as jet or a droplet. In the present comparative example, the target generation device 12 supplies the target substance as a droplet DL into the chamber 10. The target generation device 12 uses, for example, melted tin (Sn) as the target substance. The target substance is not limited to tin but may be terbium, gadolinium, lithium, or xenon or may include a combination of two materials or more.

At least one through-hole is provided to the wall of the chamber 10. The through-hole is blocked by a window 17. The pulse laser beam 11a output from the driver laser 11 transmits through the window 17. For example, an EUV condenser mirror 20 having a spheroidal surface is disposed inside the chamber 10. The EUV condenser mirror 20 has first and second focal points. For example, a multi-layer reflective film obtained by alternately stacking molybdenum and silicon is formed on the surface of the EUV condenser mirror 20. The EUV condenser mirror 20 is disposed so that, for example, the first focal point is positioned in a plasma generation region 21 and the second focal point is positioned at an intermediate focus point (IF) 22. A through-hole 23 is provided at a central part of the EUV condenser mirror 20.

In addition, a laser beam condenser mirror 24 is provided inside the chamber 10. The pulse laser beam 11a incident in the chamber 10 from the driver laser 11 through the window 17 is reflected by the laser beam condenser mirror 24 and passes through the through-hole 23.

The EUV light generation device 1 also includes a connection part 25 that provides communication between the inside of the chamber 10 and the inside of an exposure device 2 to be described later. The connection part 25 is formed in a substantially conical shape having a diameter that decreases as the position moves from the plasma generation region 21 toward the intermediate focus point 22. A wall 26 at which an aperture 25a is formed is provided to a leading end part of the connection part 25. The wall 26 is disposed so that the aperture 25a is positioned at the intermediate focus point 22.

The control unit 13 is connected with the driver laser 11 and the target generation device 12. The control unit 13 provides synchronization between the timing of outputting of the pulse laser beam 11a by the driver laser 11 and the timing of outputting of the droplet DL by the target generation device 12. The control unit 13 is also connected with the stage 18. During outputting of the droplet DL by the target generation device 12, the control unit 13 adjusts the position of the target generation device 12 relative to the chamber 10 by controlling the stage 18 based on a value detected by a position sensor (not illustrated) configured to detect the position of the droplet DL.

The EUV light generation device 1 also includes an etching gas supply device 14 and an exhaust device 15 connected with the chamber 10.

In addition, the EUV light generation device 1 includes a chamber mount 10a shaped in accordance with the shape of the chamber 10. The chamber mount 10a holds the chamber 10 in such a posture that the optical axis of EUV light emitted from the EUV condenser mirror 20 is oblique to the direction of gravity. This is because the optical axis of the exposure device 2 is oblique to the direction of gravity. The chamber 10 does not need to be tilted when a tilted mirror is provided in the EUV light generation device 1 to align the optical axis of the EUV light with the optical axis of the exposure device 2. However, the reflectance of EUV light by the tilted mirror is 60% approximately, and thus the use efficiency of the EUV light is reduced when the tilted mirror is provided. For this reason, no tilted mirror is provided, but the chamber 10 is tilted.

When fitted to the chamber mount 10a, the chamber 10 is correctly held in a posture in which the optical axis of the EUV light aligns with the optical axis of the exposure device 2.

Hereinafter, the direction of the optical axis of the EUV light emitted from the EUV condenser mirror 20 is referred to as a Z direction, and the output direction of the droplet DL output from the target generation device 12 is referred to as a Y direction. The Z direction and the Y direction are orthogonal to each other. In addition, a direction orthogonal to the Z direction and the Y direction is referred to as an X direction. The X direction is orthogonal to the direction of gravity.

In the present comparative example, the mounting part 16 is provided to the chamber 10 to hold the target generation device 12 in a posture in which the Y direction as the output direction of the droplet DL is not parallel nor orthogonal to the direction of gravity.

1.1.2 Operation

The following describes the operation of the EUV light generation device 1 with reference to FIG. 1. The pulse laser beam 11a output from the driver laser 11 transmits through the window 17 and is incident in the chamber 10. The pulse laser beam 11a is reflected by the laser beam condenser mirror 24, passes through the through-hole 23, and is condensed in the plasma generation region 21.

The target generation device 12 outputs the droplet DL toward the plasma generation region 21. The droplet DL is irradiated with at least one pulse included in the pulse laser beam 11a. The droplet DL irradiated with the pulse laser beam 11a turns into plasma, and radiation light is emitted from the plasma. The EUV light included in the radiation light is selectively reflected by the EUV condenser mirror 20. The EUV light reflected by the EUV condenser mirror 20 is condensed at the intermediate focus point 22 and output to the exposure device 2.

Through repetition of the above-described operation, for example, debris of the droplet DL is gradually accumulated on the EUV condenser mirror 20 and the like in the chamber 10, and thus cleaning operation is performed to remove the debris as appropriate. The cleaning operation may be performed during the EUV light generation operation or while the EUV light generation operation is stopped. In the cleaning operation, etching gas is supplied into the chamber 10 from the etching gas supply device 14. When the droplet DL is tin, the etching gas preferably contains hydrogen. Stannane generated through reaction between the etching gas and the debris or the like, and the etching gas not reacted with the debris or the like are discharged by the exhaust device 15. The exhaust device 15 maintains the inside of the chamber 10 at low pressure.

1.2 Target Generation Device

1.2.1 Configuration

Figure 2:
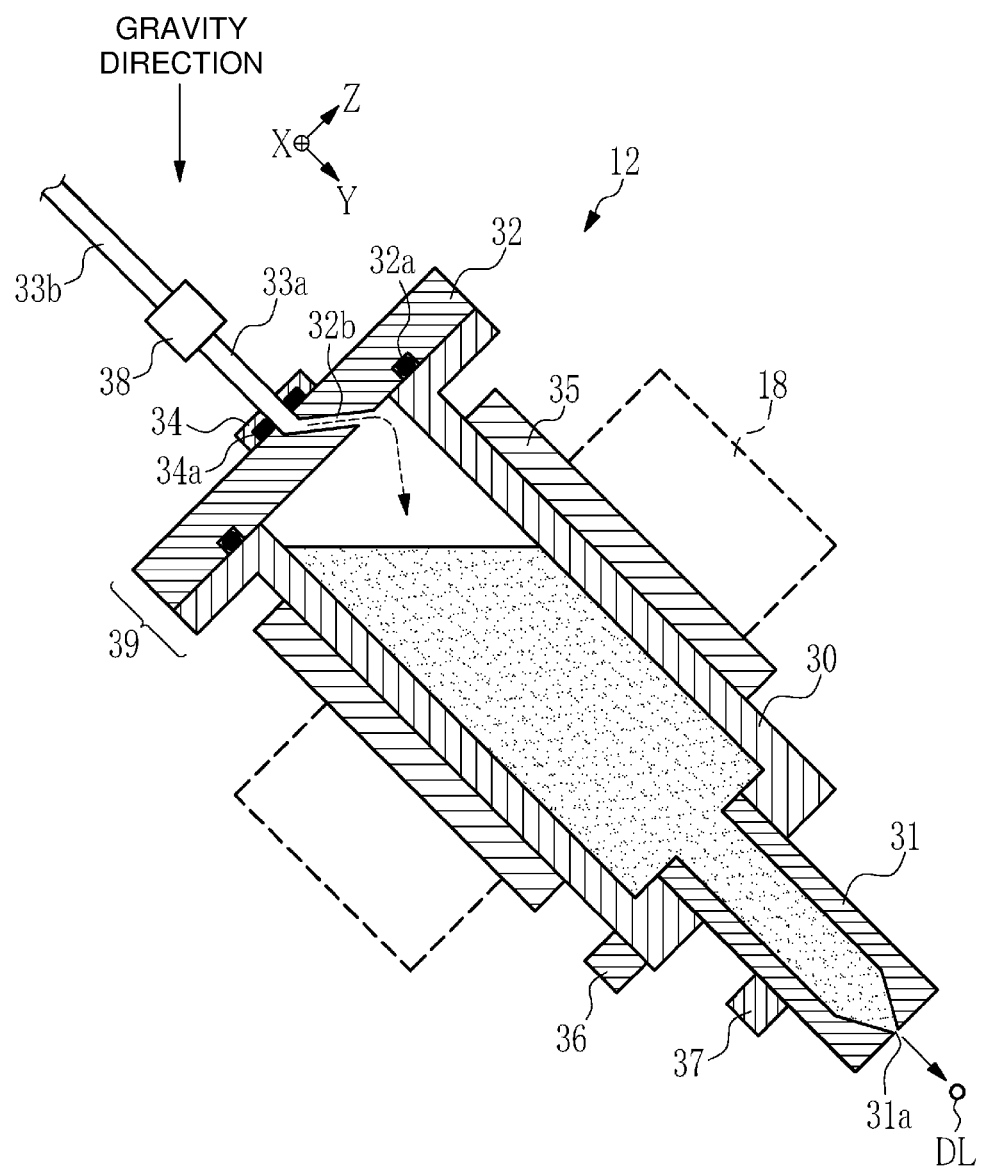
FIG. 2 is a cross-sectional view illustrating the configuration of a target generation device.

In FIG. 2, the target generation device 12 includes a tank 30, a nozzle 31, a lid 32, a pipe 33a, a heater 35, a temperature sensor 36, and a piezoelectric element 37. The tank 30 is a tubular member made of, for example, molybdenum and houses the target substance inside. The nozzle 31 is made of, for example, molybdenum and connected with one end of the tank 30. A nozzle hole 31a through which the target substance is output as the droplet DL is formed at a leading end part of the nozzle 31.

The lid 32 is made of, for example, molybdenum and connected with the other end of the tank 30. The lid 32 has a disk shape and is joined with an end part of the tank 30 through an O ring 32a. The lid 32 includes a gas flow path 32b through which inert gas circulates. In addition, the lid 32 is connected with, through an O ring 34a, a flange 34 provided at an end part of the pipe 33a. The pipe 33a is communicated with the gas flow path 32b. The pipe 33a is connected with, through a joint 38, a pipe 33b connected with a pressure adjuster (not illustrated). The inert gas is supplied from a gas tank included in the pressure adjuster into the tank 30 through the pipe 33b, the pipe 33a, and the gas flow path 32b. The lid 32 and the end part of the tank 30 form a connection part 39 to be described later.

The heater 35 is provided on the outer peripheral surface of the tank 30, and heats the tank 30 to melt the target substance containing tin in the tank 30. The temperature sensor 36 is disposed near the nozzle 31 on the outer peripheral surface of the tank 30, and detects the temperature of the tank 30 near the installation position of the temperature sensor 36. The piezoelectric element 37 is provided on the outer peripheral surface of the nozzle 31, and provides vibration to the nozzle 31. The heater 35, the temperature sensor 36, and the piezoelectric element 37 are connected with the control unit 13 described above.

1.2.2 Operation

The control unit 13 controls the temperature of the heater 35 to maintain the target substance in the tank 30 at a predetermined temperature based on a temperature detection signal output from the temperature sensor 36. The control unit 13 also controls the pressure adjuster to pressurize the inside of the tank 30 to a predetermined pressure by the inert gas, thereby outputting the target substance containing melted tin through the nozzle hole 31a. The pressure inside the tank 30 in this case is, for example, 40 MPa approximately.

In addition, the control unit 13 supplies the piezoelectric element 37 with electrical power having a predetermined waveform to provide vibration to the nozzle 31, and provide disturbance to the target substance output from the nozzle hole 31a, thereby generating the droplet DL. The speed, interval, and generation frequency of the droplet DL are controlled by the pressure in the tank 30 and the waveform provided to the piezoelectric element 37.

1.3 Chamber Movement Mechanism

When the EUV light generation device 1 is obliquely installed as described above, for maintenance of the EUV light generation device 1, it is not easy to remove the chamber 10 or part of the chamber 10 and move the chamber 10 or the part to a maintenance region. Thus, a movement mechanism is provided to move the chamber 10 being positioned relative to the exposure device 2 to the maintenance region.

Figure 3:
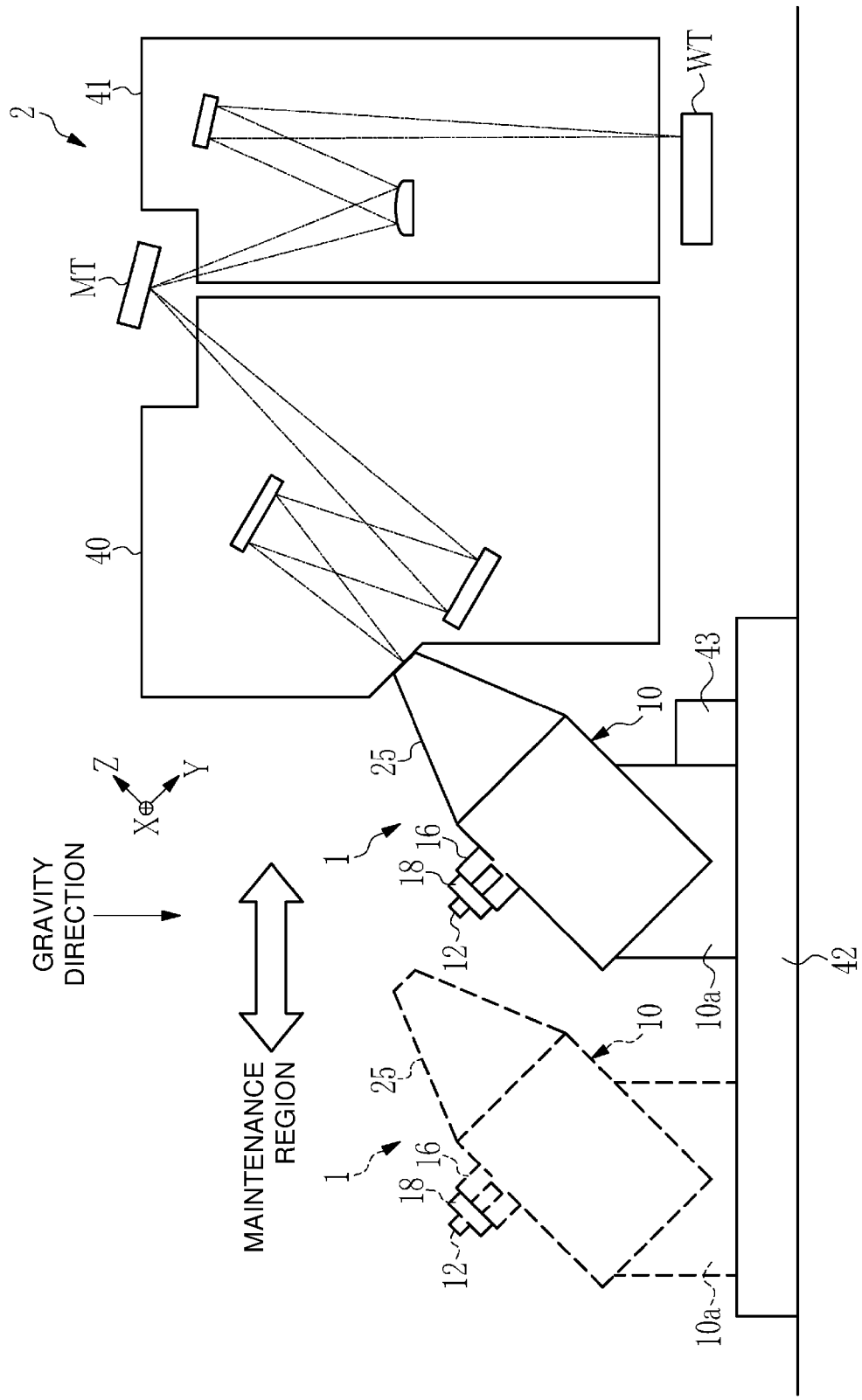
FIG. 3 is an explanatory diagram for description of a mechanism for moving a chamber relative to an exposure device.

In FIG. 3, the exposure device 2 includes a mask irradiation unit 40 and a workpiece irradiation unit 41. The mask irradiation unit 40 causes the EUV light incident from the EUV light generation device 1 to be incident on a mask pattern of a mask table MT through a reflective optical system. The workpiece irradiation unit 41 causes the EUV light reflected by the mask table MT to be imaged on a workpiece such as a semiconductor wafer (not illustrated) disposed on a workpiece table WT through a reflective optical system. The exposure device 2 moves the mask table MT and the workpiece table WT simultaneously in parallel to expose the workpiece through the mask pattern.

A movement mechanism 42 is provided to move the chamber 10, and a positioning mechanism 43 is provided to position the chamber 10 relative to the exposure device 2. The positioning mechanism 43 positions the chamber mount 10a so that the chamber 10 is positioned at a predetermined position at which the optical axis of the EUV light emitted from the EUV light generation device 1 coincides with the optical axis of the mask irradiation unit 40. FIG. 3 illustrates, with solid lines, a state in which the chamber 10 is positioned at the predetermined position at which the optical axis of the EUV light coincides with the optical axis of the mask irradiation unit 40.

The movement mechanism 42 moves the chamber 10 between the position at which the chamber 10 is positioned by the positioning mechanism 43 and the maintenance region in which maintenance is possible. The movement mechanism 42 includes, for example, a rail (not illustrated) and a slider slidably provided to the rail. The movement mechanism 42 may be provided with a wheel in place of the slider. FIG. 3 illustrates, with dashed lines, a state in which the chamber 10 is moved to the maintenance region.

1.4 Target Generation Device Replacement Method

Kinds of maintenance performed in the maintenance region include replacement of the target generation device 12. The target generation device 12 needs to be replaced when the target substance housed in the tank 30 is all output from the nozzle 31 or the remaining amount thereof becomes equal to or smaller than a predetermined amount.

To replace the target generation device 12, first, the chamber 10 is moved to the maintenance region by the movement mechanism 42. Then, in the maintenance region, the target generation device 12 currently mounted at the mounting part 16 of the chamber 10 is removed.

Figure 4A:
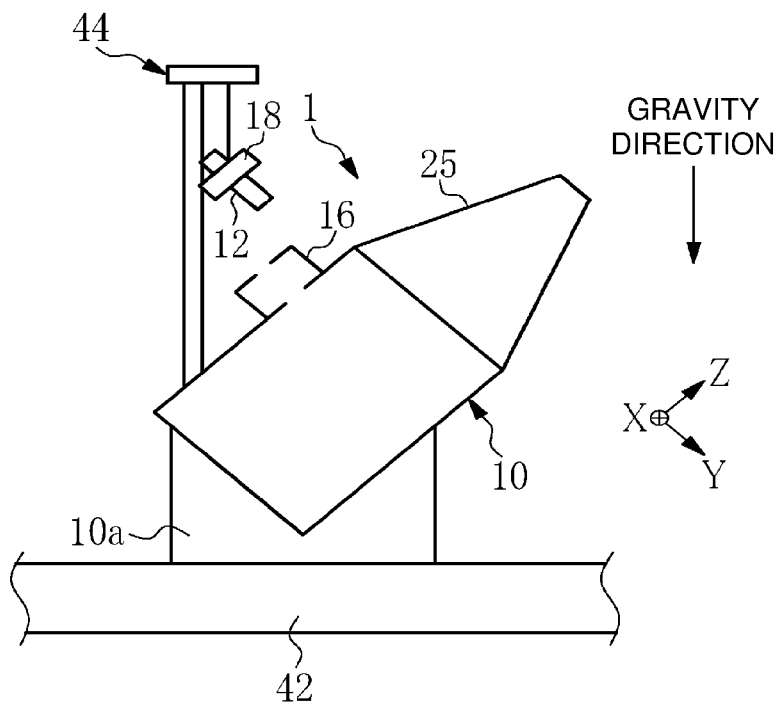
FIGS. 4A and 4B are diagrams for description of a method of attaching the target generation device.
Figure 4B:
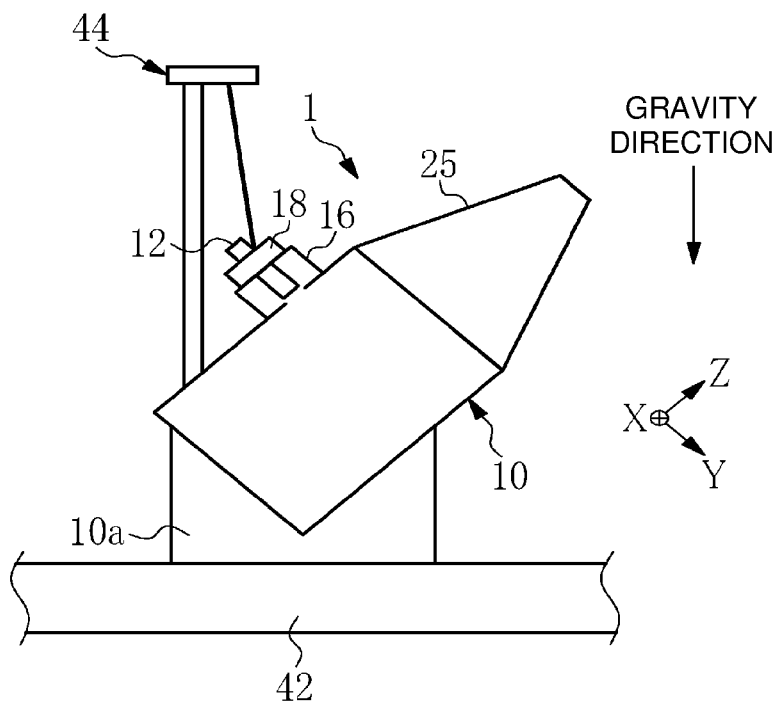

FIGS. 4A and 4B are diagrams for description of a method of attaching the target generation device 12. To attach the target generation device 12 to the mounting part 16 of the chamber 10, first, the target generation device 12 in which the tank 30 is filled with the target substance is suspended by a crane 44 as illustrated in FIG. 4A. The crane 44 is disposed near the chamber 10 in the maintenance region. While the target generation device 12 is suspended by the crane 44, a worker mounts the target generation device 12 on the mounting part 16 as illustrated in FIG. 4B while secondarily holding the target generation device 12. Then, the worker fixes the target generation device 12 to the mounting part 16 by, for example, a bolt (not illustrated) while holding airtightness between the target generation device 12 and the mounting part 16 through, for example, an O ring (not illustrated).

The chamber 10, the target generation device 12 of which is replaced as described above is moved, by the movement mechanism 42, to the position at which the chamber 10 is positioned by the positioning mechanism 43.

1.5 Problem

The operation time of the EUV light generation device 1 is desired to be extended as much as possible. The operation time of the EUV light generation device 1 depends on the capacity of the tank 30 of the target generation device 12, and thus the capacity of the tank 30 needs to be increased to extend the operation time. For example, the current capacity of the tank 30 is 800 cc approximately, but it is considered to increase the capacity to 3200 cc approximately in order to extend the operation time.

In addition, the power of the EUV light from the EUV light generation device 1 is desired to be increased. To increase the power of the EUV light, the power of the pulse laser beam 11a from the driver laser 11 needs to be increased. The increase in the power of the pulse laser beam 11a leads to increase in the influence range of debris from plasma generated through irradiation of the droplet DL with the pulse laser beam 11a in the plasma generation region 21.

The increase in the debris influence range subsequently disturbs the trajectory of the droplet DL flying to the plasma generation region 21, and as a result, the droplet DL is potentially not appropriately irradiated with the pulse laser beam 11a in the plasma generation region 21. Consequently, the power of the EUV light is destabilized. To prevent this destabilization, increasing the interval of droplets DL is considered. The increase in the interval of droplets DL leads to increase in the emission time interval of the EUV light. To prevent this, the pressure inside the tank 30 due to the inert gas needs to be increased to speed up the droplet DL. To increase the pressure in the tank 30, the wall thickness of the tank 30 needs to be increased so that the pressure resistance of the tank 30 is improved. As a result, the weight of the tank 30 is increased.

For example, the tank 30 currently has a capacity of 800 cc approximately and a weight of 95 kg approximately. When the capacity of the tank 30 is increased to 3200 cc approximately for the above-described reason, the weight increases to 300 kg approximately. When the weight of the tank 30 is increased in this manner due to increase in the capacity, the above-described replacement method of the target generation device 12, which is performed by the worker while secondarily holding the target generation device 12 suspended by the crane 44, suffers limitations and difficulties.

In addition, the size of the stage 18 needs to be increased along with increase in the size of the target generation device 12. The increase in the size of the stage 18 causes further difficulties to attachment and removal of the target generation device 12 to and from the chamber 10.

Furthermore, when the size of the target generation device 12 is increased, the chamber 10 is deformed by loads of the target generation device 12 and the stage 18, which reduces accuracy in the position of the target generation device 12 relative to the chamber 10.

2. First Embodiment

The following describes an EUV light generation system according to a first embodiment of the present disclosure. In the following description, any component same as that in the comparative example is denoted by an identical reference sign, and description thereof is omitted as appropriate.

2.1 Configuration

2.1.1 Overall Configuration

Figure 6:
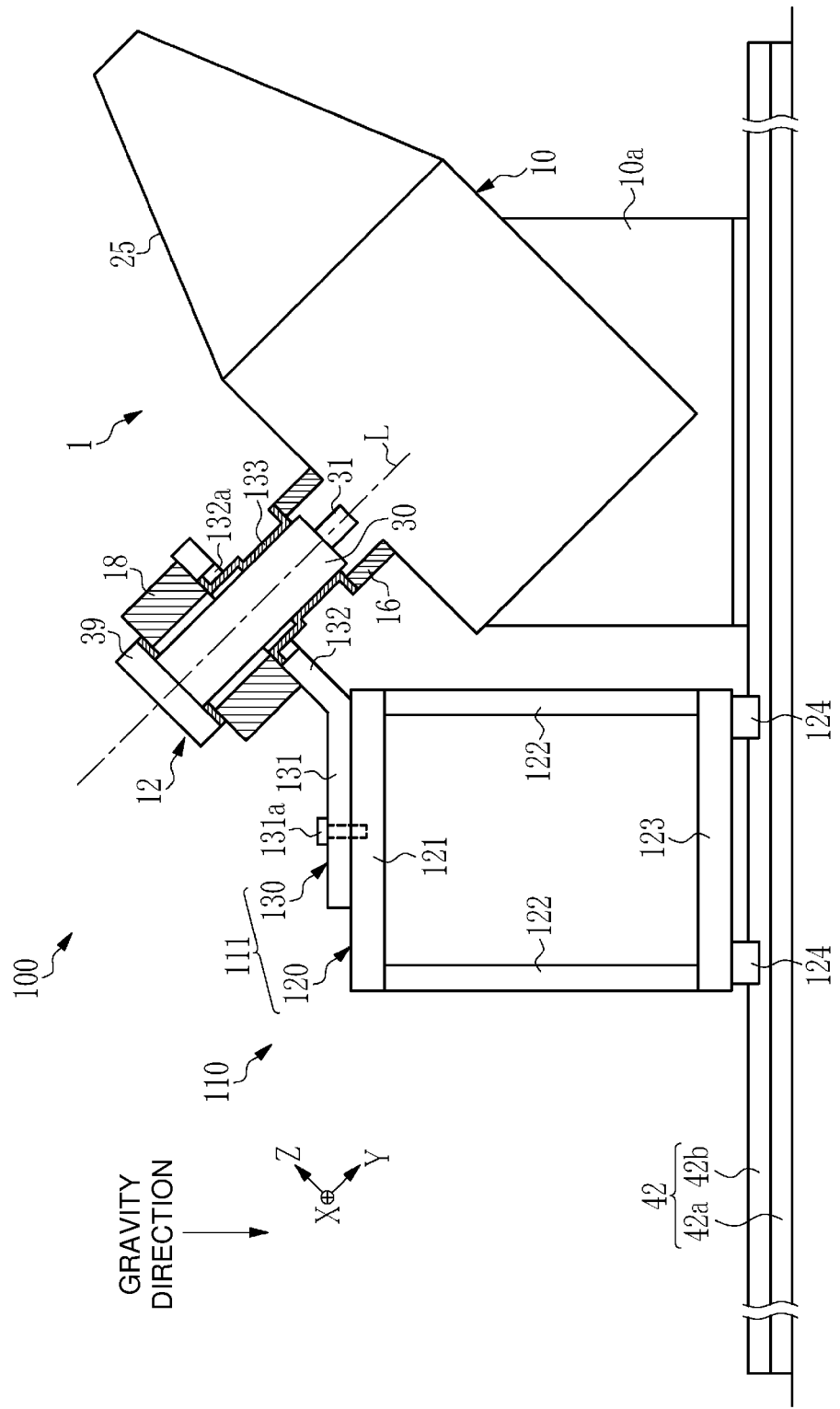
FIG. 6 is a diagram schematically illustrating the configuration of the EUV light generation system according to the first embodiment in a state in which the mount is close to the chamber.

FIGS. 5 and 6 each schematically illustrate the configuration of an EUV light generation system 100 according to the first embodiment. In FIG. 5, the EUV light generation system 100 includes the EUV light generation device 1 and a mount 110. The EUV light generation device 1 has a configuration same as that of the EUV light generation device 1 of the comparative example.

The mount 110 includes a mount body 111 and the stage 18 as a target position adjustment unit. The mount body 111 includes a base unit 120 and a holding unit 130. The base unit 120 includes a plurality of first beams 121, a plurality of columns 122, and a plurality of second beams 123. The first beams 121 are supported by the columns 122. The columns 122 are supported by the second beams 123. The second beams 123 are provided with a plurality of sliders 124.

The movement mechanism 42 for moving the chamber 10 includes a base 42a installed on a floor, and one or a plurality of linear rails 42*b* installed on the base 42*a*. The linear rails 42*b* extend in a direction orthogonal to the X direction in a horizontal plane orthogonal to the direction of gravity. The chamber mount 10*a* is movably provided on the linear rails 42*b*.

The sliders 124 provided to the mount body 111 are slidably engaged with the linear rails 42*b*. The mount body 111 can be moved by the movement mechanism 42 in the direction orthogonal to the X direction in the horizontal plane orthogonal to the direction of gravity. The mount body 111 may be provided with wheels engaged with the linear rails 42*b* in place of the sliders 124.

The holding unit 130 is connected with the first beams 121. The holding unit 130 includes a first member 131 fixed to the base unit 120, and a second member 132 that holds the target generation device 12. The first member 131 and the second member 132 are joined with each other. The first member 131 is fixed to the base unit 120 by a fixation bolt 131*a*. In the present embodiment, the first member 131 is joined with the first beams 121. In the present embodiment, the holding unit 130 may be formed integrally with the mount body 111.

An opening 132*a* into which the target generation device 12 is inserted is formed at the second member 132. The opening 132*a* is connected with an attachment flange 133 for attaching the target generation device 12 to the mounting part 16 of the chamber 10. The target generation device 12 is attached to the attachment flange 133 in a posture in which the target generation device 12 aligns with the output direction of the droplet DL. One end of the attachment flange 133 is connected with the stage 18. The other end of the attachment flange 133 is connected with the mounting part 16 of the chamber 10.

The stage 18 is provided between and connected with the connection part 39 of the target generation device 12 and the attachment flange 133. The stage 18 moves the target generation device 12 relative to the attachment flange 133 in the X direction and the Z direction orthogonal to the Y direction as the emission axis of the droplet DL. The X direction and the Z direction correspond to a first direction and a second direction, respectively.

2.1.2 Stage

Figure 7:
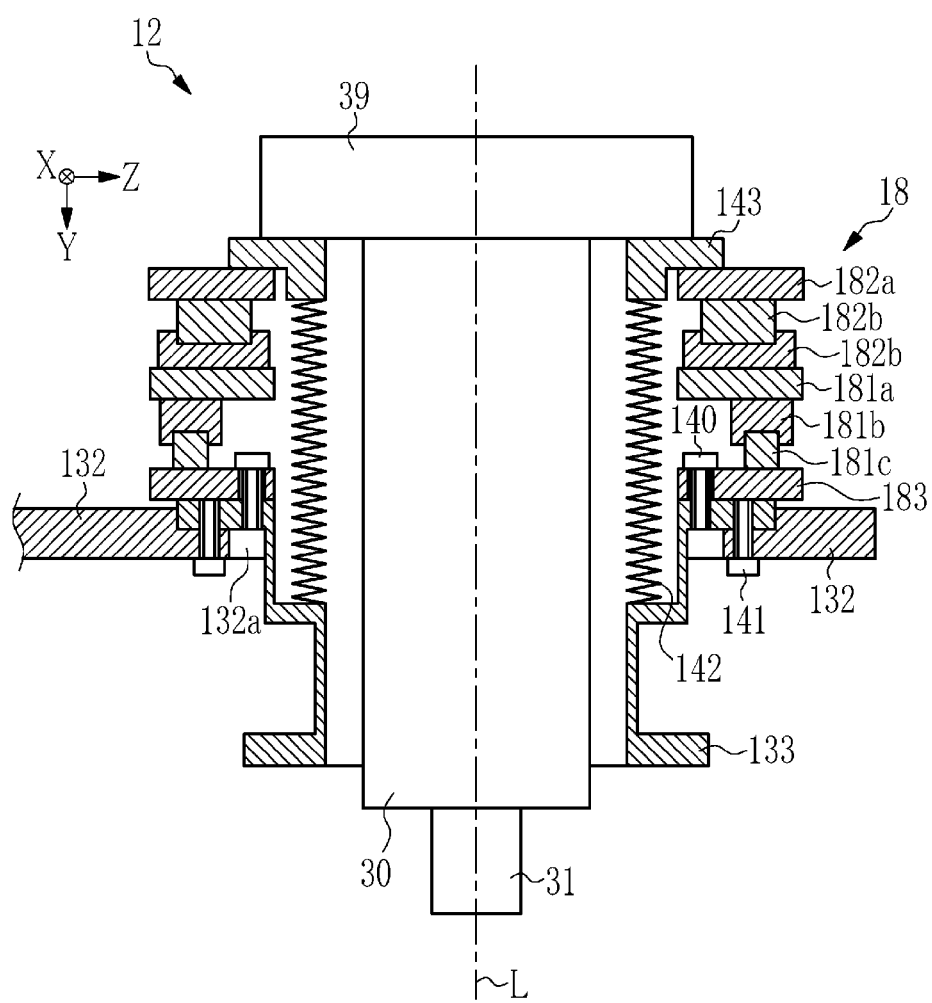
FIG. 7 is a cross-sectional view illustrating the configuration of a stage.

FIG. 7 is a cross-sectional view illustrating the configuration of the stage 18. The stage 18 includes an X-axis stage 181*a*, an X-axis linear guide 181*b*, an X-axis saddle 181*c*, a Z-axis stage 182*a*, a Z-axis linear guide 182*b*, a Z-axis saddle 182*c*, and a base member 183. The stage 18 is a two-dimensional stage.

The X-axis stage 181*a* is driven in the X direction under control of the control unit 13. The X-axis linear guide 181*b* is connected with the X-axis stage 181*a*. The X-axis saddle 181*c* slidably holds the X-axis linear guide 181*b* in the X direction. The X-axis saddle 181*c* is fixed to the base member 183. The base member 183 is fixed to the attachment flange 133 by a fixation bolt 140. The attachment flange 133 is fixed to the second member 132 by a fixation bolt 141.

The Z-axis stage 182*a* is driven in the Z direction under control of the control unit 13. The Z-axis linear guide 182*b* is connected with the Z-axis stage 182*a*. The Z-axis saddle 182*c* slidably holds the Z-axis linear guide 182*b* in the Z direction. The Z-axis saddle 182*c* is fixed on the X-axis stage 181*a*.

An annular attachment part 143 to which the target generation device 12 is attached is fixed on the Z-axis stage 182*a*. The connection part 39 of the target generation device 12 is detachably attached to the attachment part 143. A bellows 142 is provided between and connected with the attachment part 143 and the attachment flange 133. The bellows 142 and the attachment flange 133 cover around the tank 30 of the target generation device 12. While the attachment flange 133 is mounted at the mounting part 16 of the chamber 10, the tank 30 and the nozzle 31 are communicated with the inside of the chamber 10 by the bellows 142, the attachment flange 133, and the connection part 39 and sealed in an airtight manner.

2.2 Operation

The following describes a method of attaching and removing the target generation device 12 in the EUV light generation system 100 with reference to FIGS. 5 and 6. First, the target generation device 12 is attached to the mount body 111 while the mount body 111 is separated from the chamber 10 as illustrated in FIG. 5. Specifically, the tank 30 is inserted into the bellows 142 and the attachment flange 133.

Subsequently, the mount body 111 is horizontally moved closer to the chamber 10 by the movement mechanism 42, and the attachment flange 133 is attached to the mounting part 16 of the chamber 10 while the mount body 111 is close to the chamber 10 as illustrated in FIG. 6. Then, the connection part 39 of the target generation device 12 is attached to the attachment part 143. In the EUV light generation system 100 in the state illustrated in FIG. 6, the target generation device 12 outputs the droplet DL, and the driver laser 11 outputs the pulse laser beam 11*a*, thereby generating the EUV light. Thus, the stage 18 adjusts the relative positions of the target generation device 12 and the chamber 10 while the target generation device 12 held by the mount body 111 is attached to the chamber 10.

Thereafter, when the target generation device 12 is to be replaced, connection between the attachment flange 133 and the mounting part 16 of the chamber 10 is canceled, and connection between the connection part 39 of the target generation device 12 and the attachment part 143 is canceled. Then, the target generation device 12 is removed from the chamber 10, and the mount body 111 is horizontally moved in a direction departing from the chamber 10 by the movement mechanism 42. Then, in the state illustrated in FIG. 5, the target generation device 12 is removed from the mount body 111 and replaced with a new target generation device 12.

2.3 Effect

In the first embodiment, the target generation device 12 is connected with the chamber 10 and operated while the target generation device 12 is held on the mount body 111. Thus, the target generation device 12 can be easily attached to and removed from the chamber 10 even when the size of the target generation device 12 is increased. Accordingly, maintainability is improved.

Furthermore, in the first embodiment, since the target generation device 12 can be positioned relative to the chamber 10 while the target generation device 12 is held by the mount body 111, positioning accuracy is improved.

Moreover, in the first embodiment, since the stage 18 is provided to the mount body 111, the target generation device 12 can be easily attached to and removed from the chamber 10 even when the size of the stage 18 is increased along with increase in the size of the target generation device 12. In addition, since the target generation device 12 and the stage 18 are held by the mount body 111, the chamber 10 can be prevented from being deformed by loads of the target generation device 12 and the stage 18. Accordingly, the accuracy of positioning of the target generation device 12 relative to the chamber 10 is improved.

3. Second Embodiment

The following describes an EUV light generation system according to a second embodiment of the present disclosure. In the following description, any component same as that in the comparative example is denoted by an identical reference sign, and description thereof is omitted as appropriate.

3.1 Configuration

An EUV light generation system 100a according to the second embodiment includes the EUV light generation device 1 and a mount 110a. The EUV light generation device 1 has a configuration same as that of the EUV light generation device 1 of the comparative example.

The mount 110a includes a mount body 111a and the stage 18. The stage 18 has a configuration same as that of the first embodiment. The mount body 111a includes a base unit 120a and a holding unit 130a. The movement mechanism 42 for moving the chamber 10 and the mount body 111a has a configuration same as that of the first embodiment.

The holding unit 130a is connected with the first beams 121. The holding unit 130a includes the first member 131 and the second member 132. The first member 131 and the second member 132 are joined with each other. In the present embodiment, a rotational shaft 134 is provided at a joint part of the first member 131 and the second member 132. The rotational shaft 134 is parallel to the X direction. The rotational shaft 134 functions as a posture change mechanism configured to change the posture of the target generation device 12. In the present embodiment, the holding unit 130a can be rotated about the rotational shaft 134 by removing the fixation bolt 131a to cancel the fixation of the first member 131 and the base unit 120a.

In the present embodiment, the fixation of the first member 131 and the base unit 120a can be canceled. Specifically, the first member 131 and the base unit 120a are fixed by a fixation bolt (not illustrated), and the fixation of the first member 131 and the base unit 120a can be canceled by removing the fixation bolt. The holding unit 130a can be rotated about the rotational shaft 134 while the fixation of the first member 131 and the base unit 120a is canceled.

The base unit 120a basically has a configuration same as that of the base unit 120 of the first embodiment. The configuration of the base unit 120a according to the present embodiment is different from the configuration of the base unit 120 of the first embodiment in that a vertical positioning bracket 135 is provided. The vertical positioning bracket 135 is a positioning member provided at a position at which the target generation device 12 is positioned so that a central axis L as the droplet emission axis is vertical when the holding unit 130a is rotated as illustrated in FIG. 10.

3.2 Operation

Figure 8:
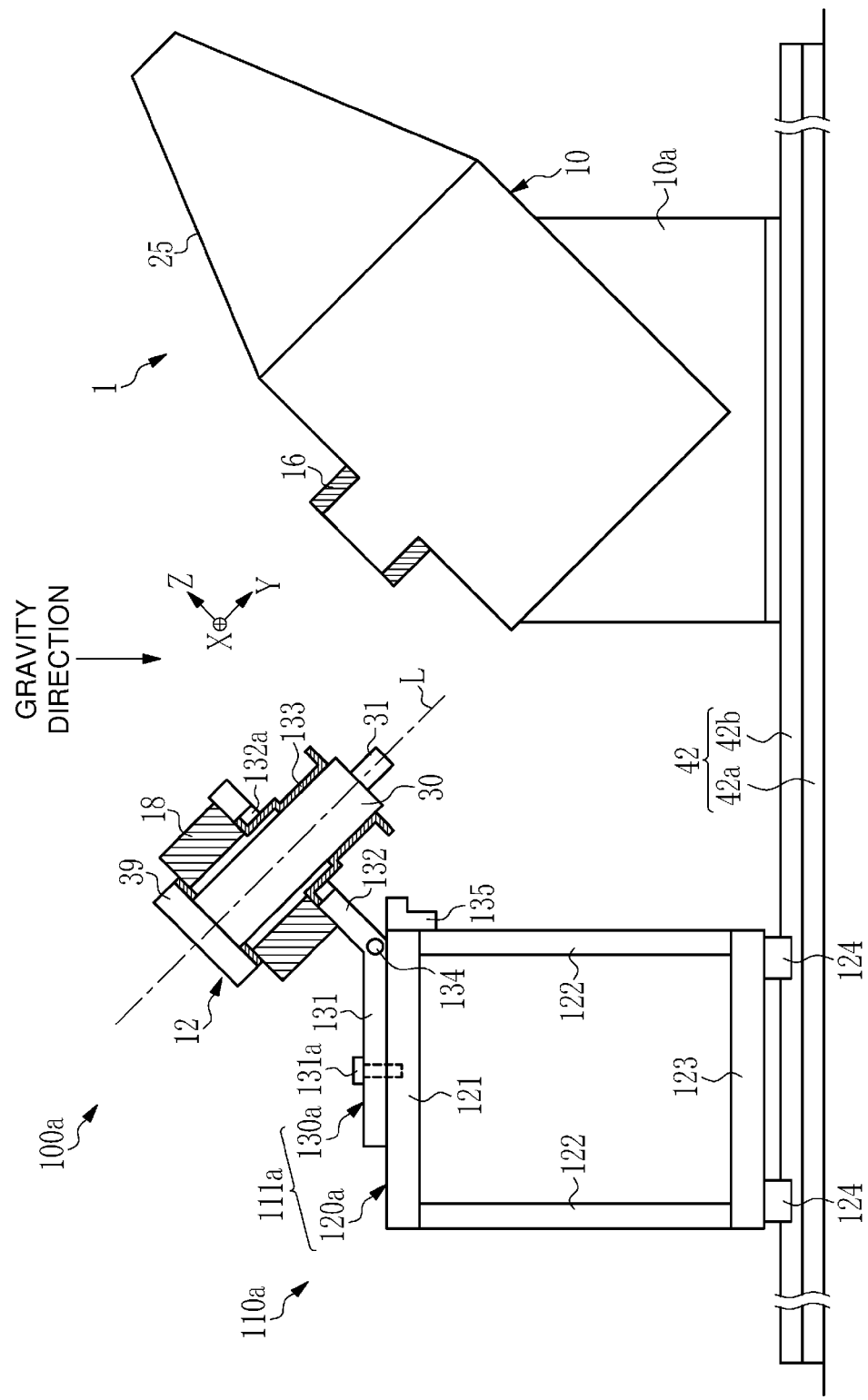
FIG. 8 is a diagram schematically illustrating the configuration of an EUV light generation system according to a second embodiment in a state in which the mount is separated from the chamber.
Figure 9:
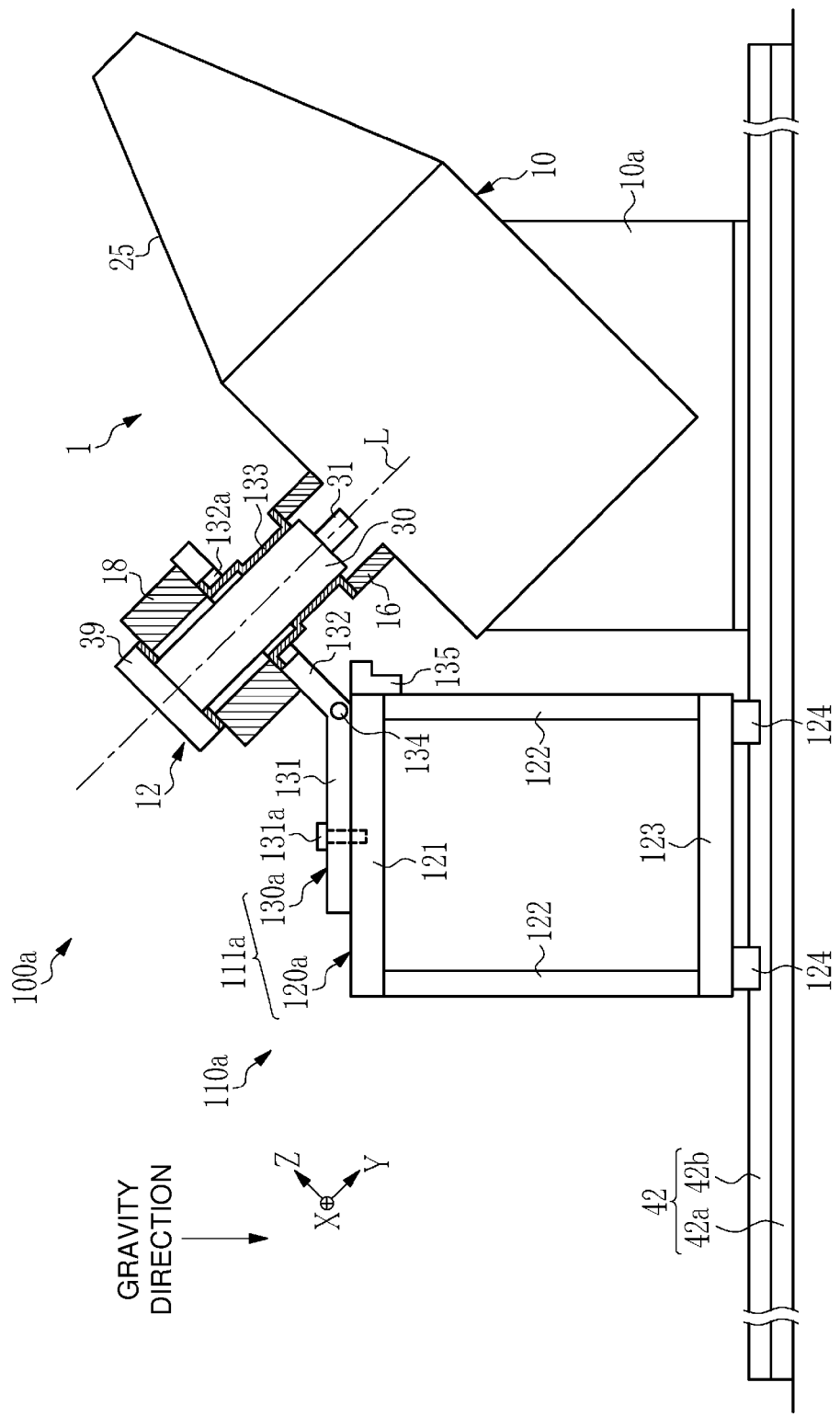
FIG. 9 is a diagram schematically illustrating the configuration of the EUV light generation system according to the first embodiment in a state in which the mount is close to the chamber.
Figure 10:
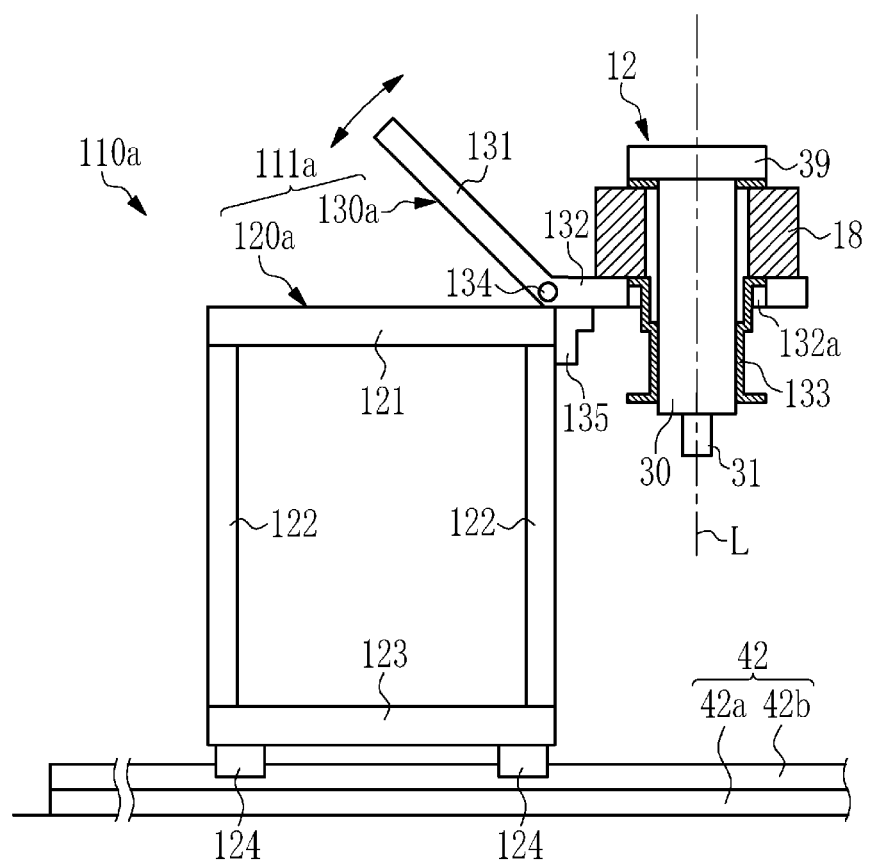
FIG. 10 is a diagram illustrating the mount when a holding unit is rotated to a position at which the target generation device is vertical.

The following describes a method of attaching and removing the target generation device 12 in the EUV light generation system 100a with reference to FIGS. 8 to 11. First, as illustrated in FIG. 10, the fixation of the first member 131 and the base unit 120a is canceled, and the holding unit 130a is rotated about the rotational shaft 134 so that the holding unit 130a contacts the vertical positioning bracket 135. In this state, the target generation device 12 is vertically moved downward by using a crane or the like and mounted on the holding unit 130a.

Subsequently, the holding unit 130a is rotated to fix the first member 131 and the base unit 120a so that the target generation device 12 is tilted as illustrated in FIG. 8. Then, similarly to the first embodiment, the mount body 111a is horizontally moved closer to the chamber 10 by the movement mechanism 42, and the attachment flange 133 is attached to the mounting part 16 of the chamber 10 while the mount body 111a is close to the chamber 10 as illustrated in FIG. 9. Thereafter, similarly to the first embodiment, the operation of the EUV light generation system 100a is performed.

When the target generation device 12 is to be replaced, the target generation device 12 is removed from the chamber 10 by a method same as that in the first embodiment, and the mount body 111a is horizontally moved in the direction departing from the chamber 10 by the movement mechanism 42. Then, in the state illustrated in FIG. 8, the fixation of the first member 131 and the base unit 120a is canceled, and the holding unit 130a is rotated about the rotational shaft 134 so that the holding unit 130a contacts the vertical positioning bracket 135.

Figure 11:
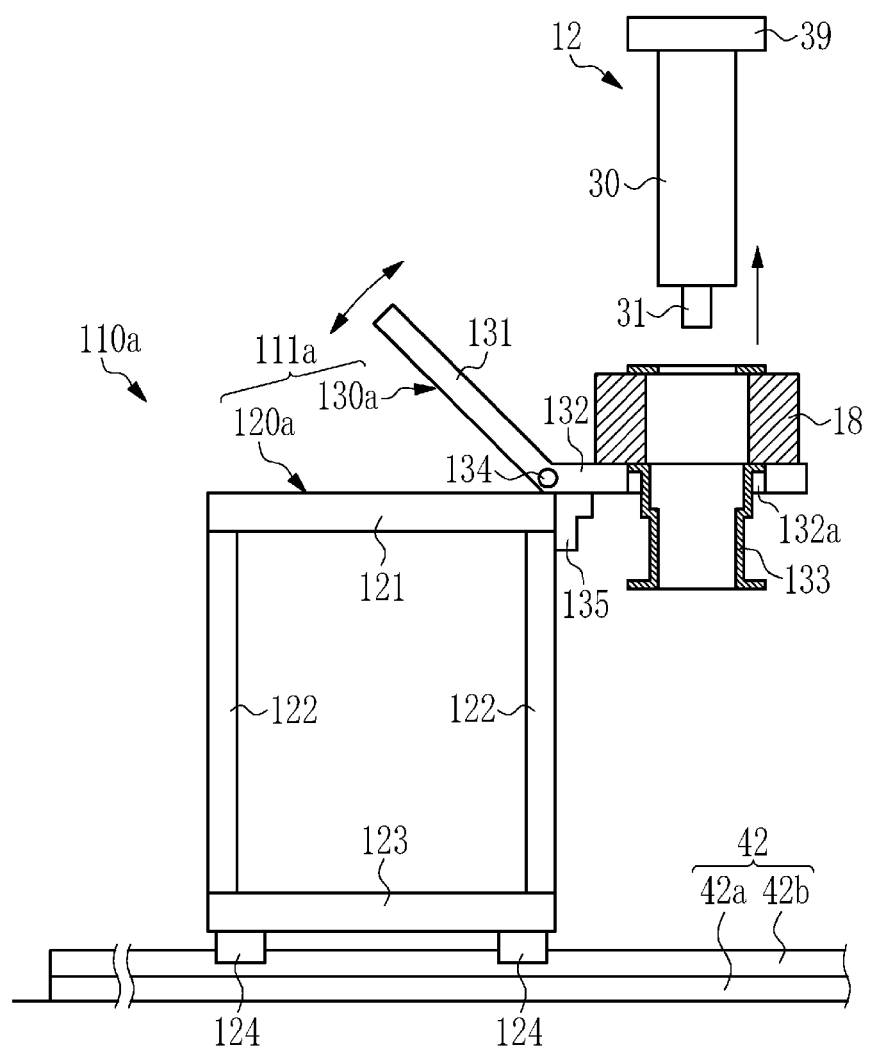
FIG. 11 is a diagram illustrating a state in which the target generation device is removed from a mount body.

Thereafter, the target generation device 12 is vertically moved up by using a crane or the like as illustrated in FIG. 11 so that the target generation device 12 is removed from the mount body 111a and replaced with a new target generation device 12.

3.3 Effect

In the second embodiment, since the holding unit 130a can be rotated, the mount body 111a can change the posture of the target generation device 12 so that the central axis L is vertical while holding the stage 18 and the target generation device 12. Thus, the target generation device 12 can be replaced by using a typical crane or the like without using a dedicated replacement jig needed to obliquely pull out the target generation device 12.

In the present embodiment, the vertical positioning bracket 135 is provided to the mount body 111a, but may be removable from the mount body 111a. As illustrated in FIGS. 10 and 11, the vertical positioning bracket 135 may be attached to the mount body 111a only when the holding unit 130a is to be rotated.

4. Third Embodiment

The following describes an EUV light generation system according to a third embodiment of the present disclosure. In the following description, any component same as that in the comparative example is denoted by an identical reference sign, and description thereof is omitted as appropriate.

4.1 Configuration

Figure 12:
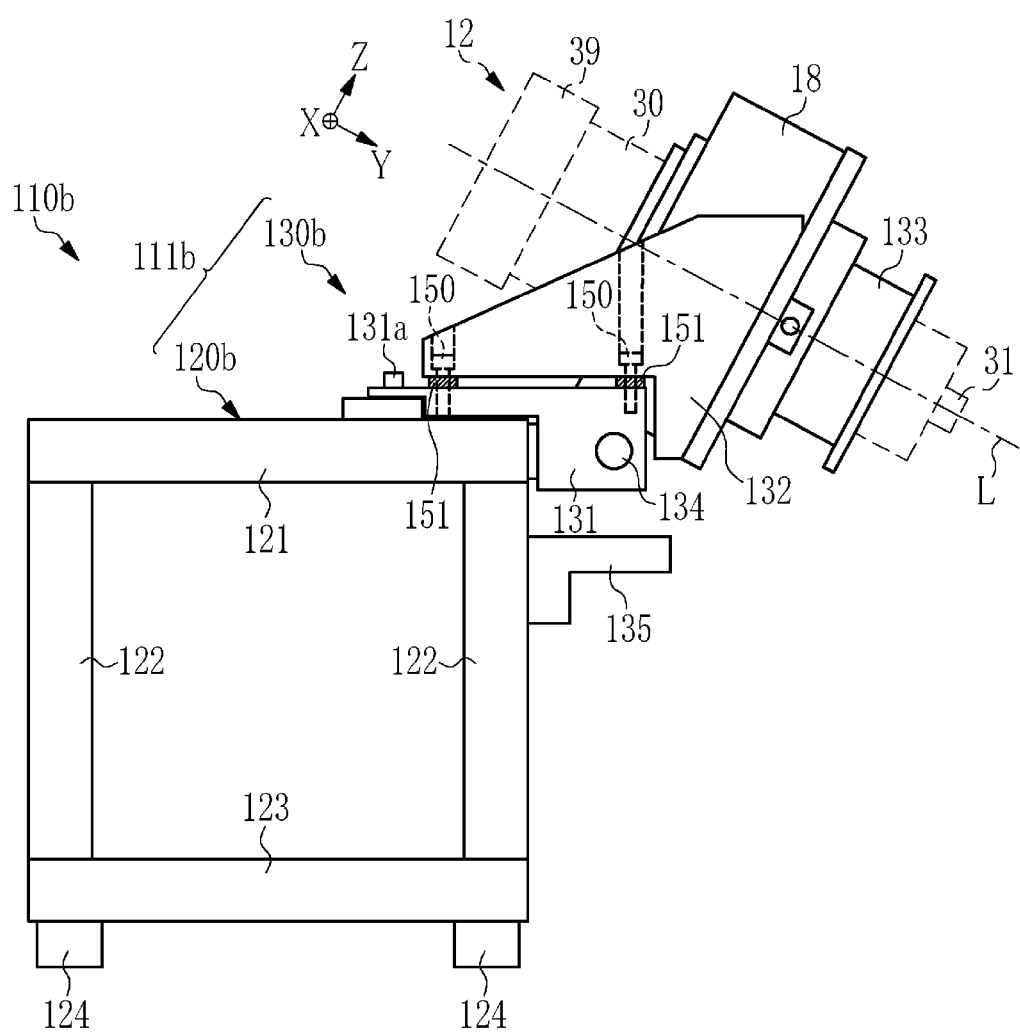
FIG. 12 is a side view of the mount included in the EUV light generation system according to the first embodiment.
Figure 13:
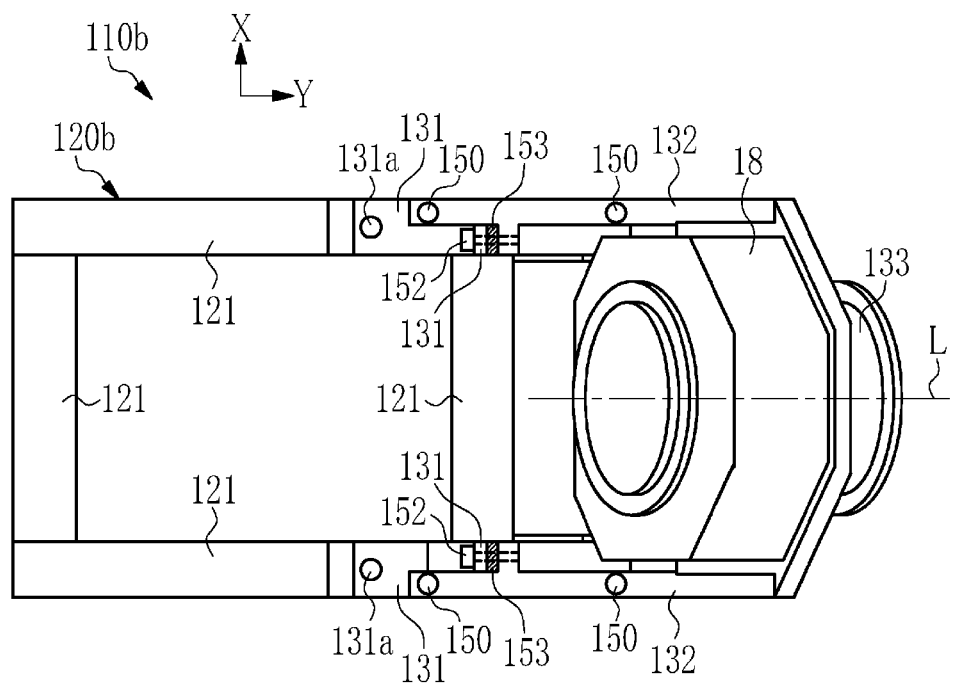
FIG. 13 is a top view of the mount included in the EUV light generation system according to the first embodiment.

FIGS. 12 and 13 illustrate the configuration of a mount 110b included in the EUV light generation system according to the third embodiment. The mount 110b has a configuration same as that of the mount 110a of the second embodiment except that the mount 110b includes an alignment adjustment mechanism configured to adjust the position of connection of the stage 18 with the chamber 10.

The mount 110b includes a mount body 111b and the stage 18. The stage 18 has a configuration same as that of the first embodiment. The mount body 111b includes a base unit 120b and a holding unit 130b. The base unit 120b has a configuration same as that of the base unit 120a of the second embodiment. In the present embodiment, the holding unit 130b is more specifically described. The holding unit 130b includes the first member 131, the second member 132, and the rotational shaft 134. In the present embodiment, the first member 131 and the second member 132 are separated from each other, and the rotational shaft 134 is provided to the first member 131.

In the present embodiment, the holding unit 130b includes a first alignment adjustment mechanism, a second alignment adjustment mechanism, and a third alignment adjustment mechanism. The first alignment adjustment mechanism is constituted by a first fixation bolt 150 and a first adjustment shim 151. The first fixation bolt 150 vertically connects the first member 131 and the second member 132. The first adjustment shim 151 is interposed between the first member 131 and the second member 132 connected by the first fixation bolt 150. In other words, the first fixation bolt 150 is fastened between the first member 131 and the second member 132 through the first adjustment shim 151. Thus, the vertical position of the stage 18 can be adjusted by changing the thickness of the first adjustment shim 151 and the number thereof. In the present embodiment, the first fixation bolts 150 are provided at four places as illustrated in FIG. 13.

The second alignment adjustment mechanism is constituted by a second fixation bolt 152 and a second adjustment shim 153. The second fixation bolt 152 horizontally connects the first member 131 and the second member 132. The second adjustment shim 153 is interposed between the first member 131 and the second member 132 connected by the second fixation bolt 152. In other words, the second fixation bolt 152 is fastened between the first member 131 and the second member 132 through the second adjustment shim 153. Thus, the horizontal position of the stage 18 can be adjusted by changing the thickness of the second adjustment shim 153 and the number thereof. In the present embodiment, the second fixation bolts 152 are provided at two places as illustrated in FIG. 13.

Figure 14:
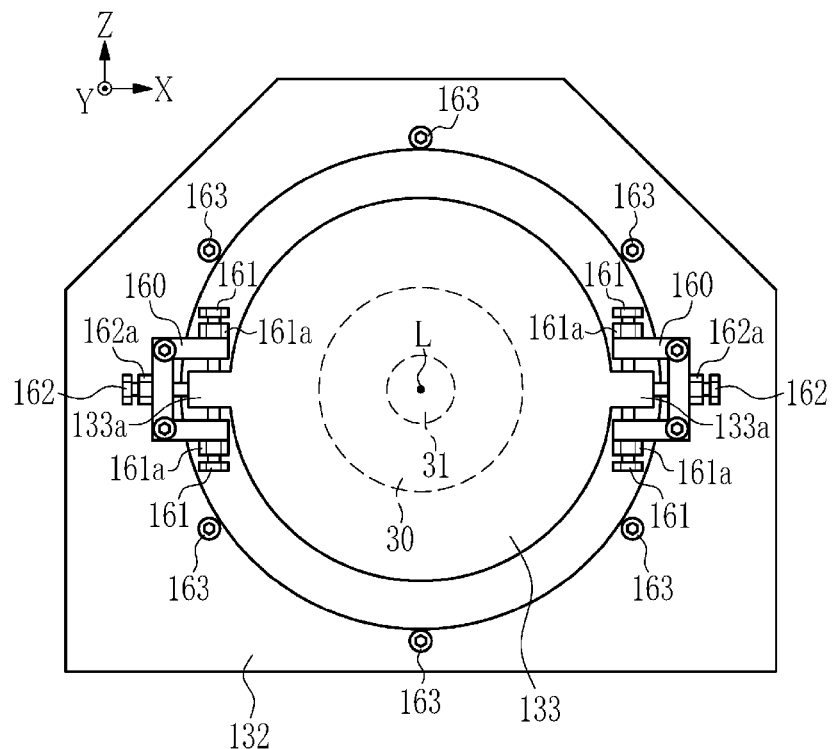
FIG. 14 is a front view of an attachment flange when viewed in a Y direction.
Figure 15:
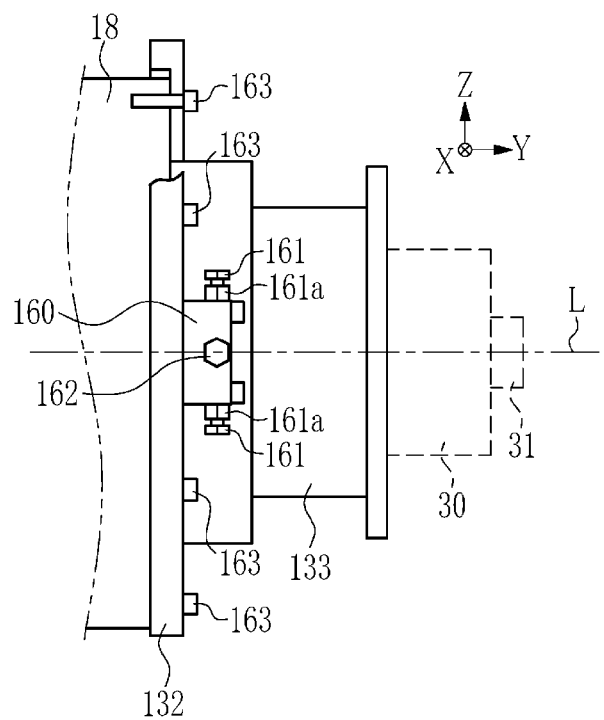
FIG. 15 is a side view of the attachment flange when viewed in an X direction.

FIGS. 14 and 15 illustrate the configuration of the third alignment adjustment mechanism. The third alignment adjustment mechanism includes an alignment block 160, a first pressing bolt 161, and a second pressing bolt 162. Multiple components of each of these kinds are provided at right and left symmetric positions on the attachment flange 133 connected with the stage 18.

The alignment block 160 is connected with the second member 132. The alignment block 160 may be provided integrally with the second member 132. The first pressing bolt 161 is screwed into a screw hole formed at the alignment block 160 through a lock nut 161a, and a leading end part of the first pressing bolt 161 presses a convex portion 133a formed at the attachment flange 133 in the Z direction. Two pairs of the first pressing bolt 161 and the lock nut 161a are provided to the convex portion 133a so that the convex portion 133a is sandwiched between the pairs. The convex portion 133a is provided at each of the right and left positions on the attachment flange 133.

The second pressing bolt 162 is screwed into a screw hole formed at the alignment block 160 through a lock nut 162a, and a leading end part of the second pressing bolt 162 presses the convex portion 133a in the X direction. The second pressing bolt 162 and the lock nut 162a are provided at each of the right and left symmetric positions on the attachment flange 133.

The stage 18 is fixed to the second member 132 by a plurality of stage fixation screws 163.

The position of the stage 18 in the Z direction can be adjusted by changing the pressing amount of the first pressing bolt 161. In addition, the position of the stage 18 in the X direction can be adjusted by changing the pressing amount of the second pressing bolt 162.

The change of the pressing amounts of the first pressing bolt 161 and the second pressing bolt 162 is performed while fastening of the stage fixation screws 163 is relaxed. The stage fixation screws 163 may be fastened to fix the stage 18 to the second member 132 after the change of the pressing amounts.

4.2 Effect

In the third embodiment, since the alignment adjustment mechanism is provided to the holding unit 130b, the position of connection of the stage 18 with the chamber 10 can be adjusted. For example, the position of the stage 18 can be adjusted by the first to third alignment adjustment mechanisms to adjust the degree of alignment between the central axis L as the emission axis of the droplet DL and the central axis of the mounting part 16 of the chamber 10 or the interval between the attachment flange 133 and the mounting part 16. Accordingly, the position accuracy of the emission axis of the droplet DL at replacement of the target generation device 12 can be increased.

5. Exposure Device

Figure 16:
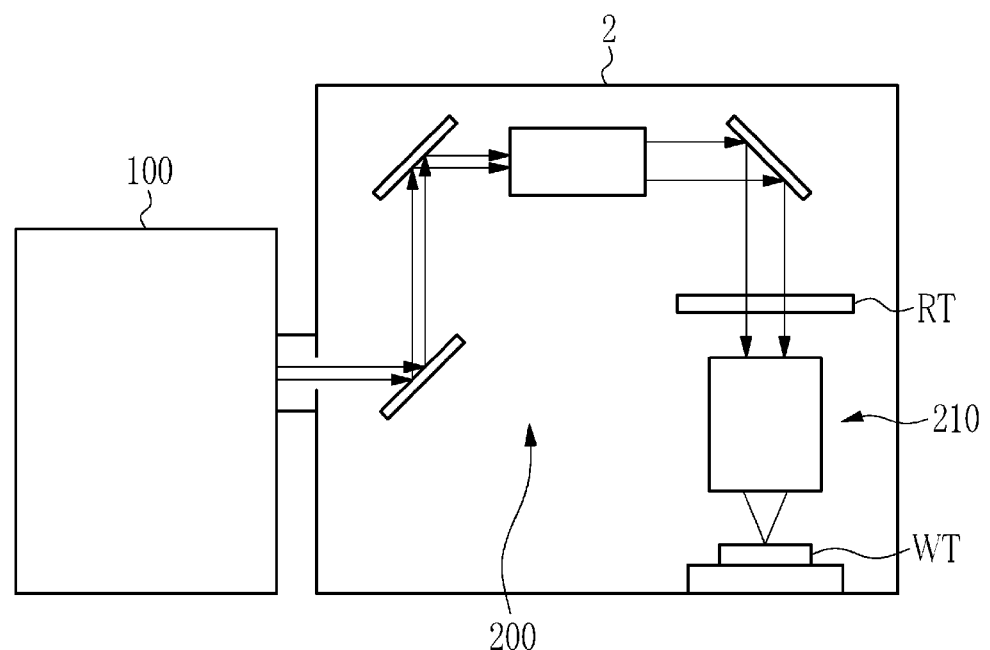
FIG. 16 is a diagram illustrating the configuration of the exposure device.

The following describes the configuration of the exposure device 2. In FIG. 16, the exposure device 2 includes an illumination optical system 200 and a projection optical system 210. The illumination optical system 200 illuminates a reticle pattern of a reticle stage RT with a laser beam incident from the EUV light generation system 100. The projection optical system 210 causes the laser beam having transmitted through the reticle to be imaged on a workpiece (not illustrated) disposed on the workpiece table WT through reduced projection. The workpiece is a photosensitive substrate such as a semiconductor wafer to which photoresist is applied.

The exposure device 2 translates the reticle stage RT and the workpiece table WT in synchronization to expose the workpiece to the laser beam with the reticle pattern reflected. An exposure process as described above is employed to manufacture a semiconductor device. The semiconductor device can be manufactured by transferring a device pattern onto the semiconductor wafer through the exposure process as described above and fabricating the semiconductor wafer.

The EUV light generation system 100a according to the second embodiment or an EUV light generation system 100b according to the third embodiment may be used in place of the EUV light generation system 100 according to the first embodiment.

The description above is intended to be illustrative and the present disclosure is not limited thereto. Therefore, it would be obvious to those skilled in the art that various modifications to the embodiments of the present disclosure would be possible without departing from the spirit and the scope of the appended claims. Further, it would be also obvious for those skilled in the art that embodiments of the present disclosure would be appropriately combined.

The terms used throughout the present specification and the appended claims should be interpreted as non-limiting terms. For example, terms such as "comprise", "include", "have", and "contain" should not be interpreted to be exclusive of other structural elements. Further, indefinite articles "a/an" described in the present specification and the appended claims should be interpreted to mean "at least one" or "one or more".

What is claimed is:

1. A mount comprising:
   A. a mount body including a holding unit that detachably holds a target generation device configured to output a target substance for extreme ultraviolet light generation as a droplet into a chamber;
   B. a target position adjustment unit that is provided to the holding unit and configured to adjust a position of the target generation device relative to the chamber; and
   C. a movement mechanism that moves the mount body at least in a horizontal direction.

2. The mount according to claim 1, wherein the target position adjustment unit is a stage configured to move the target generation device in two directions orthogonal to a droplet emission axis.

3. The mount according to claim 1, wherein the movement mechanism includes a slider provided to the mount body, and a linear rail with which the slider is slidably engaged.

4. The mount according to claim 1, further comprising:
   D. a posture change mechanism configured to change a posture of the target generation device.

5. The mount according to claim 4, wherein the posture change mechanism is configured as a rotational shaft for rotating the holding unit.

6. The mount according to claim 5, wherein the posture change mechanism includes a positioning member configured to position the target generation device to have a posture in which a droplet emission axis is vertical.

7. The mount according to claim 6, wherein the positioning member is a bracket that is provided to the mount body and contacts the holding unit.

8. The mount according to claim 1, further comprising:
   E. an alignment adjustment mechanism configured to adjust a position of connection of the target position adjustment unit with the chamber.

9. The mount according to claim 8, wherein
   the holding unit includes a first member, and a second member that is separated from the first member and configured to hold the target position adjustment unit and the target generation device, and
   the alignment adjustment mechanism includes a fixation bolt configured to connect the first member and the second member, and an adjustment shim disposed between the first member and the second member.

10. The mount according to claim 9, wherein
    the fixation bolt includes a first fixation bolt configured to vertically connect the first member and the second member, and a second fixation bolt configured to horizontally connect the first member and the second member, and
    the adjustment shim includes a first adjustment shim interposed between the first member and the second member connected by the first fixation bolt, and a second adjustment shim interposed between the first member and the second member connected by the second fixation bolt.

11. The mount according to claim 8, wherein the alignment adjustment mechanism includes a pressing bolt that is provided between and connected with the holding unit and the target position adjustment unit and configured to press the target position adjustment unit.

12. The mount according to claim 11, wherein the pressing bolt presses the target position adjustment unit in a direction orthogonal to a droplet emission axis.

13. The mount according to claim 12, wherein the pressing bolt includes a first pressing bolt configured to press the target position adjustment unit in a first direction orthogonal to the emission axis, and a second pressing bolt configured to press the target position adjustment unit in a second direction orthogonal to the emission axis and the first direction.

14. An extreme ultraviolet light generation system comprising:
    F. the mount according to claim 1; and
    G. a chamber on which the target generation device held by the mount is mounted.

15. A device manufacturing method comprising:
    exposing a workpiece to a laser beam output from the extreme ultraviolet light generation system according to claim 14.

* * * * *